United States Patent
Khalouf et al.

(10) Patent No.: US 8,666,260 B2
(45) Date of Patent: Mar. 4, 2014

(54) BURST MODE LASER TRANSMITTER HAVING AN EXTREMELY FAST RESPONSE TIME WHEN TRIGGERED FROM A TOTALLY OFF STATE

(75) Inventors: Ihab E. Khalouf, Allentown, PA (US); Kerry I. Litvin, Huntingdon Valley, PA (US)

(73) Assignee: General Instrument Corporation, Horsham, PA (US)

( * ) Notice: Subject to any disclaimer, the term of this patent is extended or adjusted under 35 U.S.C. 154(b) by 596 days.

(21) Appl. No.: 12/476,615

(22) Filed: Jun. 2, 2009

(65) Prior Publication Data
US 2010/0303471 A1    Dec. 2, 2010

(51) Int. Cl.
*H04B 10/00*    (2013.01)

(52) U.S. Cl.
USPC ........................................... 398/182; 398/201

(58) Field of Classification Search
USPC ................... 398/182–201, 115–117
See application file for complete search history.

(56) References Cited

U.S. PATENT DOCUMENTS

| | | | | |
|---|---|---|---|---|
| 5,519,530 | A * | 5/1996 | Utsumi | 359/264 |
| 6,137,607 | A * | 10/2000 | Feldman et al. | 398/167.5 |
| 6,188,498 | B1 * | 2/2001 | Link et al. | 398/195 |
| 6,282,216 | B1 * | 8/2001 | Ikeuchi et al. | 372/29.015 |
| 6,509,994 | B2 * | 1/2003 | West, Jr. | 398/192 |
| 6,714,598 | B2 | 3/2004 | Sorenson et al. | |
| 6,728,277 | B1 * | 4/2004 | Wilson | 372/38.1 |
| 6,738,401 | B2 | 5/2004 | Bowler et al. | |
| 6,859,624 | B1 | 2/2005 | Kuo et al. | |
| 7,054,564 | B2 * | 5/2006 | Ao et al. | 398/192 |
| 7,158,551 | B2 * | 1/2007 | Tochio | 372/38.02 |
| 7,614,074 | B2 * | 11/2009 | Mobley et al. | 725/129 |
| 7,864,826 | B2 * | 1/2011 | Ishibashi | 372/38.01 |
| 8,094,692 | B2 * | 1/2012 | Nakamura et al. | 372/26 |
| 8,270,834 | B2 * | 9/2012 | West, Jr. | 398/76 |
| 8,396,369 | B1 * | 3/2013 | Farmer et al. | 398/116 |
| 2002/0153956 | A1 * | 10/2002 | Wojslaw | 330/296 |
| 2002/0154371 | A1 * | 10/2002 | West, Jr. | 359/180 |
| 2002/0181057 | A1 * | 12/2002 | Ao et al. | 359/161 |
| 2005/0271099 | A1 * | 12/2005 | Miremadi | 372/38.02 |
| 2008/0002983 | A1 * | 1/2008 | Ishikawa et al. | 398/139 |

(Continued)

FOREIGN PATENT DOCUMENTS

WO    2005/076911 A2    8/2005

OTHER PUBLICATIONS

Maxim-IC, "MAX3643 Burst-Mode Laser Driver", Rev 0, Nov. 2005, pp. 1-15.*

(Continued)

*Primary Examiner* — Agustin Bello
(74) *Attorney, Agent, or Firm* — Lori Anne D. Swanson

(57) ABSTRACT

A burst mode laser transmitter includes a burst mode laser diode and a controller having an input for receiving an RF data signal. The controller includes a triggering arrangement and a modulation arrangement. The triggering arrangement is configured to bias the laser diode to an on-state bias level when an RF data signal is present at the input to the controller and to an off-state bias level when no RF data signal is present at the input to the controller. The modulation arrangement is configured to modulate the on-state bias level at which the laser diode is biased with the RF data signal only when the RF data signal is present at the input of the controller.

21 Claims, 5 Drawing Sheets

(56) References Cited

U.S. PATENT DOCUMENTS

2008/0297256 A1* 12/2008 Eken et al. .................. 330/278
2008/0310849 A1* 12/2008 West, Jr. ..................... 398/116
2010/0239251 A1* 9/2010 Biegert et al. ................ 398/58
2010/0303471 A1* 12/2010 Khalouf et al. .............. 398/186

OTHER PUBLICATIONS

"Motorola Broadens Passive Optical Network (PON) Portfolio with RF over Glass (RFoG) Solutions", EE Herald, accessed at http://www.eeherald.com/section/news/nw10000434.html on May 1, 2009.

Baumgartner, Jeff, "Fog Lifting on RFOG", Cable Digital News Analysis, written Mar. 31, 2008, accessed at http://www.lightreading.com/document.asp?doc_id=149672&site=cdn on May 1, 2009.

Baumgartner, Jeff, "RFOG Comes Rolling In", Cable Digital News Analysis, written Oct. 1, 2008, accessed at http://www.lightreading.com/document.asp?doc_id=164845&site=cdn&print=yes on May 1, 2009.

P. Solina, et al., "Burst Mode Technology—A Tutorial", 37 pages.

* cited by examiner

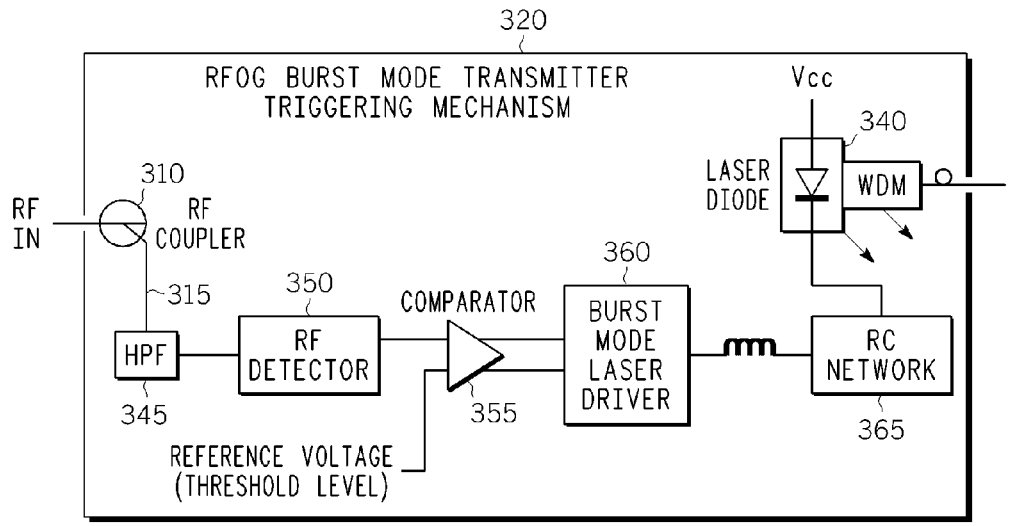
FIG. 4
FIG. 5
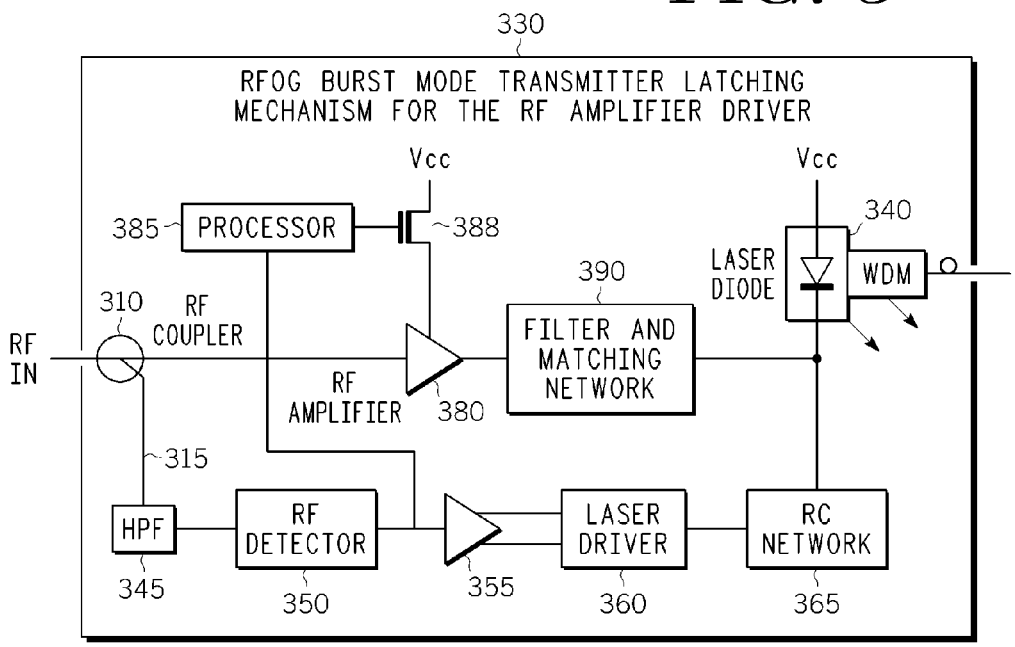

BURST MODE LASER TRANSMITTER HAVING AN EXTREMELY FAST RESPONSE TIME WHEN TRIGGERED FROM A TOTALLY OFF STATE

FIELD OF THE INVENTION

The present invention relates generally to burst mode laser transmitters employed in communications networks, and more particularly to a method and apparatus for biasing a burst mode laser transmitter so that it has an extremely fast response time when triggered from a totally off state.

BACKGROUND OF THE INVENTION

Laser diodes are typically used to transmit information over fiber optic networks. The laser diode may operate in a burst mode to achieve faster response times. In burst mode, the laser diode can be biased just around its radiation threshold in a standby or very low output power state. In this state the device outputs a minimum amount of optical energy into the surrounding network. When called upon to send information over the network the output power of the device must be rapidly ramped up to a level sufficient to transmit the data over the link length. This is done by quickly increasing the bias level current of the diode. The information being used to modulate the device is imparted upon the light by directly modulating the bias current with a signal representing the information. When the transmission is complete the bias current is once again reduced to a standby level and the output optical power, in-turn, is also reduced to a very low power standby level.

A burst mode laser is more efficient in terms of energy use and power dissipation. In contrast to a continuous mode laser, a burst mode laser transmitter produces an optical output only during selected intervals. It will be appreciated that the burst-mode transmitter is nearly turned off while it is in a standby stage and does not transmit an optical signal until a burst-mode incoming signal is received. Only upon receiving the incoming signal will the burst-mode transmitter operate, in comparison to the constant transmission of optical signals at the output of continuous mode laser transmitters. This manner of biasing a burst mode laser is illustrated in FIG. 1, which shows the optical power generated by the burst mode laser as a function of its bias current. The burst mode information, which may be encoded as a QAM (Quadrature Amplitude Modulation) signal, is also shown as being modulated on the optical output power.

It will be appreciated that the incoming signals used to bias the burst mode laser can be of various lengths of time, where some data bursts can be as short as a couple hundred nanoseconds, for instance, in the case of a DOCSIS burst signal. In a Gigabit PON (GPON) network, the minimum burst time is 32 ns including the preamble, delimiter and data. The minimum amount of data per burst is 1 byte (6.4 ns).

As indicated in FIG. 1, conventional burst mode optical transmitters that transmit analog or QAM encoded information cannot be completely turned off (no light radiation) during standby periods between bursts while also achieving the very rapid response time that is required of such systems. As a result, systems that employ these lasers must deal with the deleterious effects of the increased noise floor levels that arise when multiple laser transmitters in their lower power output state emit additive low level incoherent light into a common optical fiber transmission path. The increased noise floor levels can seriously affect the system's ability to reliably transmit analog information, including but not limited to QAM signals.

SUMMARY OF THE INVENTION

In accordance with one aspect of the invention, a burst mode laser transmitter is provided. The transmitter includes a burst mode laser diode and a controller having an input for receiving an RF data signal. The controller includes a triggering arrangement and a modulation arrangement. The triggering arrangement is configured to bias the laser diode to an on-state bias level when an RF data signal is present at the input to the controller and to an off-state bias level when no RF data signal is present at the input to the controller. The modulation arrangement is configured to modulate the on-state bias level at which the laser diode is biased with the RF data signal only when the RF data signal is present at the input of the controller.

In accordance with another aspect of the invention, a method is provided for generating an optical data signal. The method includes receiving an RF data signal that is to be transformed into an optical data signal. A bias voltage is applied to a laser diode when the received RF data signal exceeds a threshold level and removed from the laser diode when the RF data signal is below the threshold level or when no RF data signal is received. The bias voltage applied to the laser diode is modulated with the RF data signal.

BRIEF DESCRIPTION OF THE DRAWINGS

FIG. 4 shows a block diagram of one example of the laser triggering section of the burst mode laser transmitter shown in FIG. 3.

FIG. 5 shows a block diagram of one example of the modulation and laser triggering sections of the burst mode laser transmitter shown in FIG. 3.

DETAILED DESCRIPTION

Figure 1:
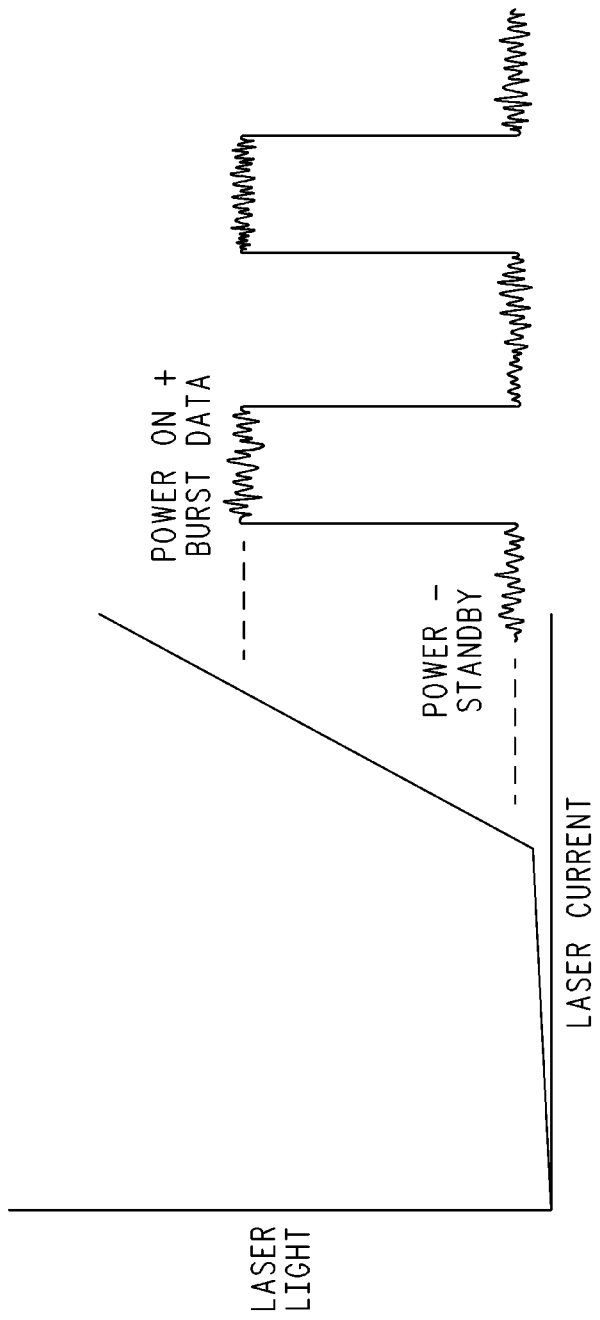
FIG. 1 shows the optical power generated by a burst mode laser as a function of its bias current and modulating burst mode information.
Figure 2:
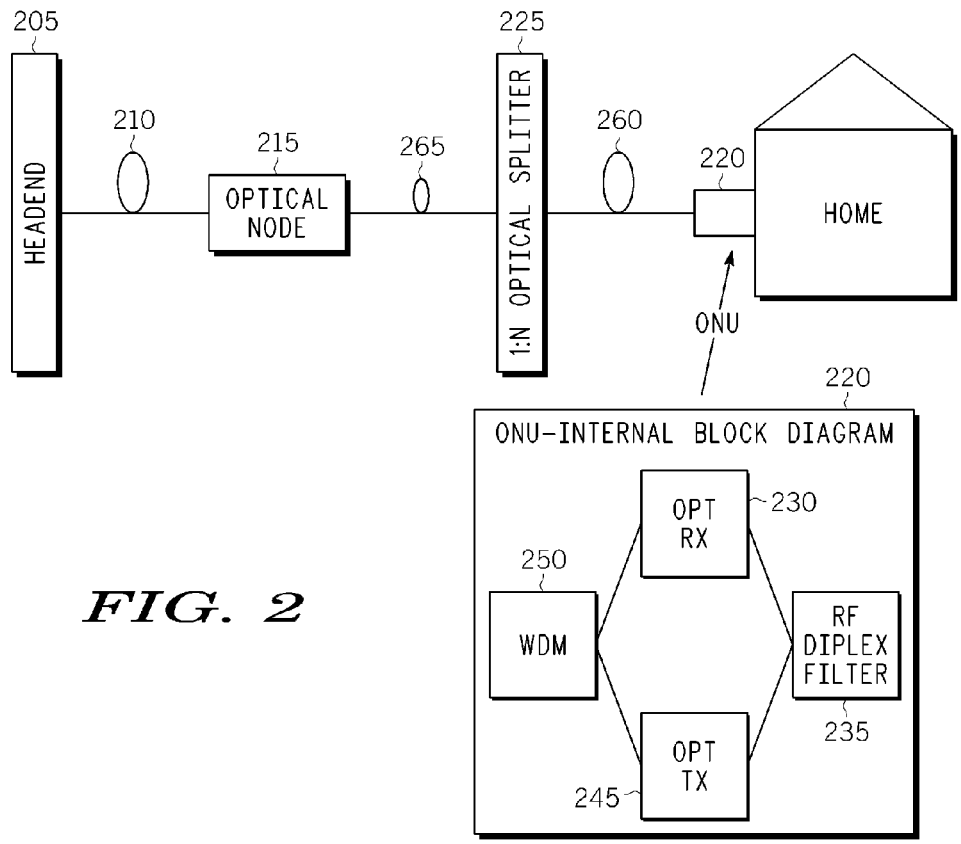
FIG. 2 shows one example of an optical communications network.

FIG. 2 shows an example of an optical communications network that may employ a burst mode laser. While a fiber to the home (FTTH) system is shown for illustrative purposes, those of ordinary skill in the art will recognize that the network may be any type in which a burst mode laser may be employed. Examples of such networks include HFC networks and passive optical networks (PONs) such Broadband PONs and Gigabit PONs.

A fiber to the home system (FTTH) such as a Radio Frequency Over Glass (RFOG) system is depicted in FIG. 2. An RFOG system provides fiber or other optical connectivity directly to the premises while using existing provisioning systems such as cable modem termination system (CMTS) platforms, headend equipment, set top boxes, conditional access technology and cable modems. A headend 205 generates and transmits optical signals downstream through fiber links, such as fiber link 210, to one or more nodes such as node 215. Each node may serve a different geographic region, depending on network design. The node 215 receives the downstream optical signals from the headend 205 and passively distributes these signals to optical network units (ONUs) such as ONU 220 using optical splitters such as splitter 225. The node 215 also receives upstream burst mode optical signals being transmitted by the ONU 220.

The ONU 220 is generally located on the customer premises and terminates the fiber connection and converts the optical signal traffic into Radio Frequency (RF) signal traffic. The ONU contains a downstream optical receiver which receives the downstream optical signal and converts it into an electrical signal that can be used by various devices found at the home, such as a cable modem, setup box, and telephone. The ONU also contains an upstream burst mode optical transmitter which transmits data to the node 215 from the various devices found in the home. The upstream and the downstream signals are transmitted over optical fibers 260 and 265 that link the node 215 and the ONU 220. More specifically, within the ONU 220 a wavelength division multiplexer (WDM) 250 separates the downstream optical signals from the upstream optical signals. The downstream optical signal is directed to an optical receiver 230 that converts the optical signals to a RF signal. A diplex filter 235 then isolates the downstream RF signals from the upstream path and provides the RF signals to the customer equipment on the premises. In the reverse or upstream path, RF signals emanating from the customer equipment are transmitted to the ONU 220. The RF signals received from the customer equipment may be digital signals, or alternatively, analog signals employing any suitable modulation scheme such as Quadrature Amplitude Modulation (QAM), for example. The diplex filter 235 isolates the upstream signals from the downstream path and provides the signals to an optical transmitter 245, which converts the RF signals to optical signals so that they can be transmitted upstream via WDM 250.

Figure 3:
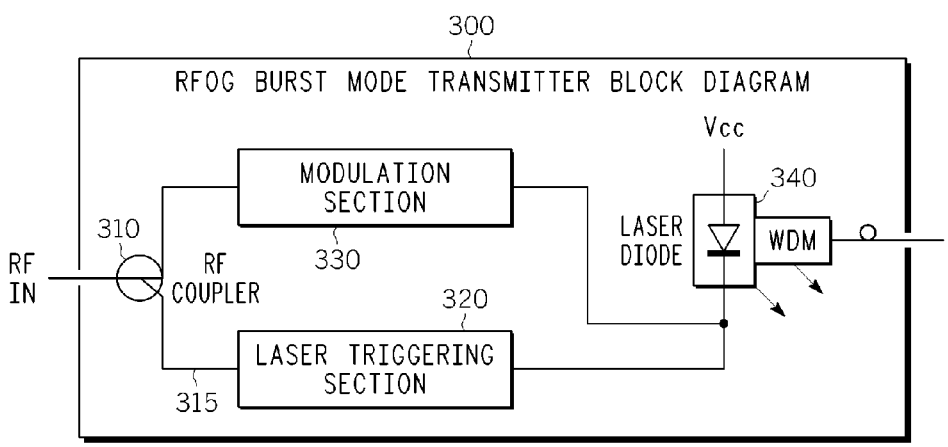
FIG. 3 is a block diagram of one example of a burst mode laser transmitter.

The optical transmitter 245 in the ONU 220 may include a burst mode laser. A simplified block diagram of a burst mode laser transmitter 300 is shown in FIG. 3. The burst mode laser transmitter 300 includes a controller and laser diode. The RF signal received from the diplex filter shown in FIG. 2 is split at the input to the transmitter by an RF coupler 310 (e.g., a 10 dB coupler) into two paths. A first path directs the RF signal to a laser triggering section 320 of the controller, which switches the laser diode 340 on or off depending upon whether or not the signal is present. A second path directs the RF signal, when present, to a modulation section 330 of the controller, which modulates the optical output from the laser diode 340.

FIG. 4 shows a block diagram of the laser triggering section 320 shown in FIG. 3. When an RF signal propagates along the triggering path 315 from the RF coupler 310 it first encounters an RF high pass filter 345. The filter 345 squelches any ingress noise so that it will not inadvertently trigger the transmitter. The filtered RF signal is next directed to a large dynamic range RF detector 350 with an extremely fast response time. Suitable RF detectors are available from Analog Devices, for example. When an appropriate RF signal is presented at the input to the RF detector 350 a proportional DC control voltage will be produced at its output. If the aforementioned Analog Devices detector is employed, the DC control voltage that is output will be proportional to the log of the RF power of the input signal. Because this detector is very fast it is capable of following even the slightest changes in the RF power levels over extremely short periods of time. In fact, in some implementations it can detect individual symbols when a QAM signal is being transmitted. However, this can be a problem since the RF detector may follow each individual QAM symbol, which may have a dynamic range as large as 30 dB, and produce correspondingly large swings in its output voltage. Such large output voltage swings may, in turn, surpass the threshold level that has been established for shutting off the laser while it is in the midst of transmitting data. To remedy this problem, a capacitor may be inserted with the detector to slow down its speed of detection (i.e., the RF detector response time). The response time may be reduced by an amount just sufficient to average out the short time power fluctuations of the QAM symbols (or bits in the case of a digital signal), thereby keeping the RF power levels that are detected well within the threshold limit. In this way the capacitor prevents false shutdown of the transmitter during signal bursts.

The control voltage at the output of the RF detector 350 is directed to a comparator circuit 355 that reacts on a rapid time frame that is comparable to the response time of the RF detector. Suitable comparator circuits are available from Analog Devices, for example. When the voltage input to the comparator 355 from the RF detector 350 exceeds a threshold voltage the comparator 355 will output a signal that is used to activate a burst mode laser driver 360 such as a laser driver that is available from Maxim, for example. In some cases the comparator 355 will output a differential signal in order to provide immunity from noise interference that could induce a false triggering of the transmitter. Laser drivers such as the aforementioned Maxim laser driver sometimes include a high speed modulator and a high speed bias driver. In these cases only the laser bias driver is employed, which is used as a fast "on-off" switch to either activate or shut off the laser diode 340 during and after signal bursts. The bias output signal from the laser driver 360 is directed to the cathode of the laser diode 340. An RC filtering network 365 may be inserted between the laser driver 360 and the laser diode 340 in order to suppress the transient overshoot of the laser diode 340 when it is turned on.

The modulation section 330 of the controller for the burst mode laser transmitter shown in FIG. 3 is shown in more detail in FIG. 5. The modulation section 330 includes an RF amplifier 380, a filter and matching network 390 and a processor 385. After splitting at the RF coupler 310, the portion of the RF signal received from the diplex filter shown in FIG. 2, which is used to modulate the laser diode 340, is directed to the RF power amplifier 380 such as model number CGA3318, for example, which is available from Sirenza Microdevices. The gain of the RF power amplifier 380 can be set to suit the Optical Modulation Index (OMI) requirements of the transmitter. One advantage that arises from the use of an RF power amplifier is that it overcomes any RF output power limitations of the RF signal source, which may be, for example, a cable modem or set top box. Another advantage is that the amplifier can overcome any excessive RF losses in the various local splitters and cabling through which the RF signal passes. In this way the laser transmitter can handle a wide dynamic range of input signal levels.

Despite the advantages that arise from the use of a RF power amplifier, one problem is that the addition of this amplifier comes at the cost of increased power dissipation and heating. However, in some implementations this problem can be overcome by coupling the mechanism that biases the power amplifier 380 to the triggering section 320 of the transmitter. In this way the RF power amplifier 380 is only turned on when an RF signal is present and it is turned off during all other times. Specifically, in the implementation shown in FIG. 5, a processor 385 controls a switch such as transistor 388 that supplies a bias voltage to the RF power amplifier 380. The processor 385 receives the control signal from the output of the RF detector 350. When a control signal is received, indicating the presence of an RF signal (i.e., data) at the input to the transmitter, the RF power amplifier 380 is turned on. In this way when the transmitter detects a first burst of RF power the power amplifier 380 is immediately turned on and latched in the on state for a predetermined period of time. The latch is refreshed with each successive detected burst. If no further bursts are detected and the latching period expires, the amplifier shuts down until new data is once again detected by the RF detector 350. In an optional configuration the laser driver 360 can also be coupled to the latching mechanism. In this arrangement both the RF power amplifier 380 and laser driver 360 would be shut down during time periods when no data is being transmitted. This latching feature helps to reduce power consumption while also negating any turn-on transient issues related to powering up the amplifier during consecutive bursts. The latching period may set to any time that is desired. However, in some implementations in which QAM symbols are employed, the latching period may be equal to a few symbol periods e.g., 2-3 symbol periods. For reference, if a 64 QAM modulation scheme is employed, the symbol period is equal to about 196 nanoseconds whereas if a 256 QAM modulation scheme is employed the symbol period is equal to about 186 nanoseconds.

The RF modulation signal output from the RF power amplifier 380 is subsequently directed to an RC filtering network for further conditioning, after which it is coupled to the cathode of the laser diode 340, where it directly modulates the optical output of the laser diode 340.

Figure 6:
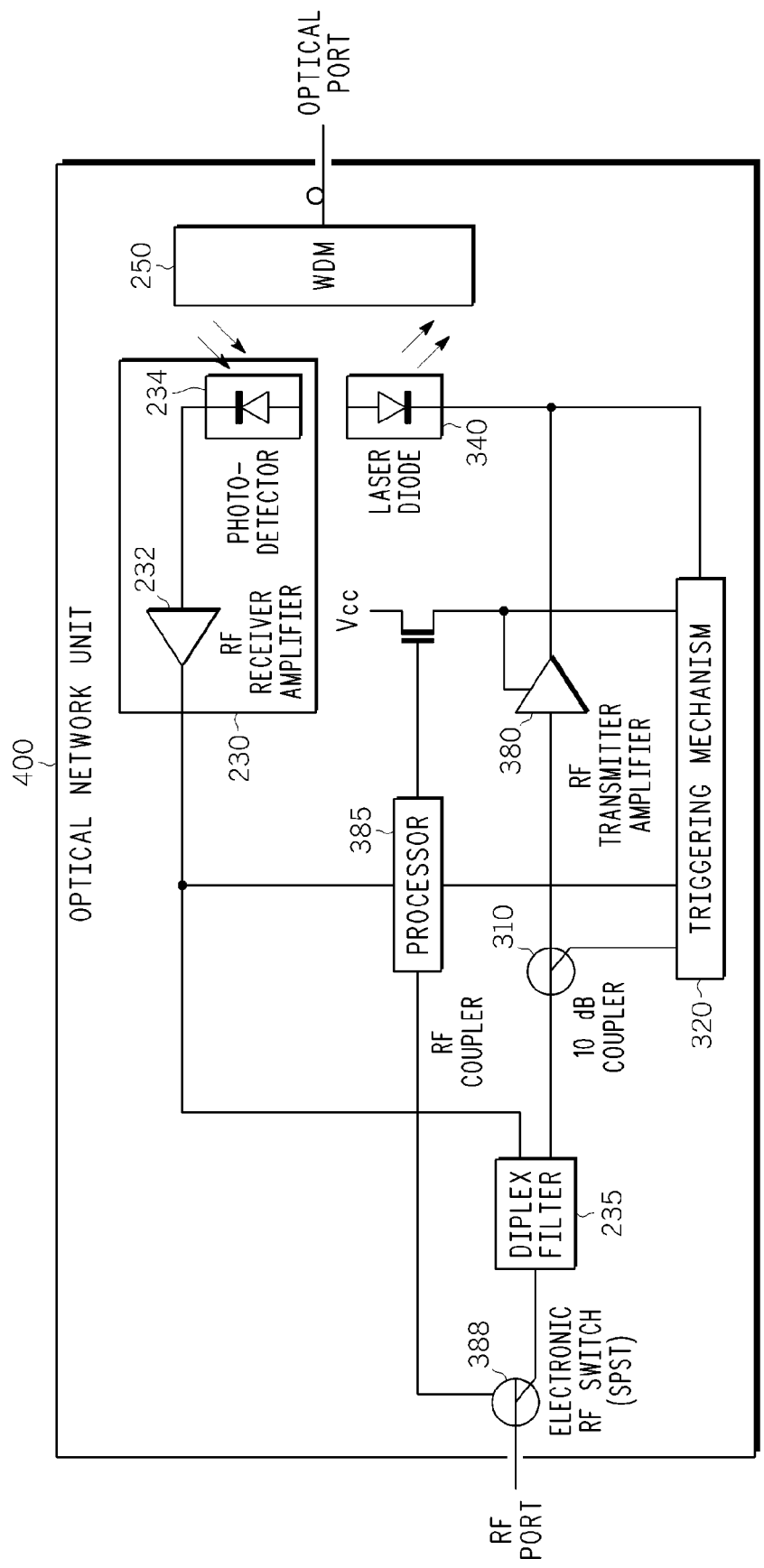
FIG. 6 shows a simplified block diagram of one example of an Optical Network Unit (ONU) that may be employed in the network of FIG. 2.

FIG. 6 shows one example of an ONU such as the ONU 220 shown in FIG. 2. The ONU 400 includes the modulation and laser triggering sections described above. In addition, the ONU 400 is configured so that its RF output can be remotely turned off. In this way the system operator can disconnect a user from the network at their discretion. This feature can be conveniently implemented by using the processor 385 that is provided in the ONU to turn on and off the RF power amplifier 380. In operation, the processor 385 receives instruction commands from the optical receiver 230 (which includes photodetector 234 and RF amplifier 232). The processor 385, in-turn, operates an electronic switch 388 such as a single pole single throw (SPST) RF switch, which operationally couples the RF signals between the ONU 400 and the customer equipment. If a command is received from the system operator instructing the ONU 400 to be disconnected, the processor 385 receives the command from the receiver 230 and opens the switch 388.

Figure 7:
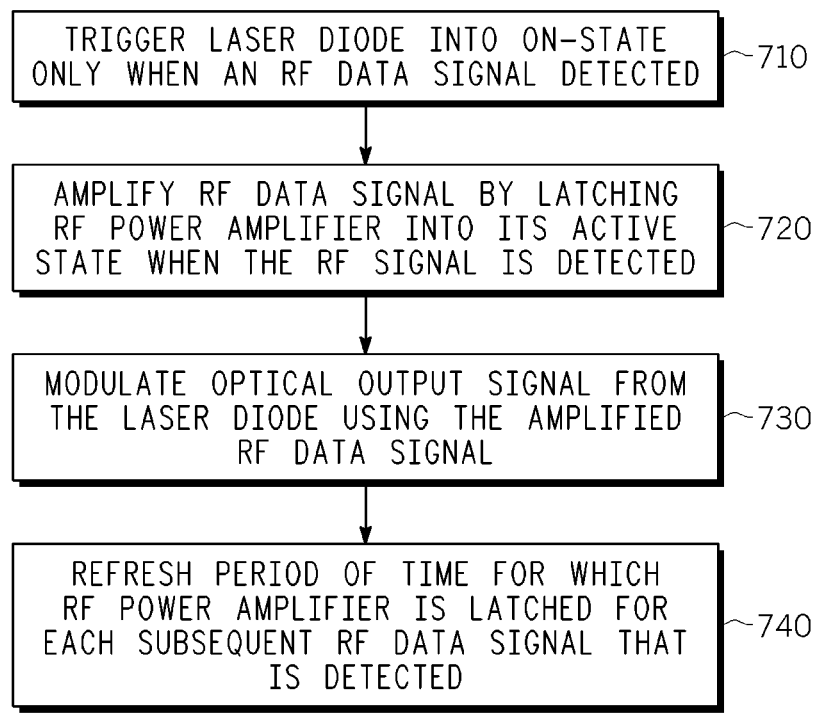
FIG. 7 is a flowchart showing one example of a method for generating an optical signal.

FIG. 7 is a flowchart showing one example of a method for generating an optical signal. In step 710 a laser diode is triggered into an on-state only when an RF data signal is detected. Additionally, in step 720, the RF data signal is amplified by latching a RF power amplifier into its active state for a predetermined period of time when the RF signal is detected. The predetermined period of time may be equal to or greater than a single data bit or symbol period. The optical output signal from the laser diode is modulated in step 730 using the amplified RF data signal. The period of time for which the RF power amplifier is latched is refreshed in step 740 each time a subsequent RF data signal is detected.

The processes described above, including but not limited to those performed by the triggering and modulation sections 320 and 330 of the controller as well as the method shown in FIG. 7, may be implemented in a general, multi-purpose or single purpose processor. Such a processor will execute instructions, either at the assembly, compiled or machine-level, to perform that process. Those instructions can be written by one of ordinary skill in the art following the description herein and stored or transmitted on a computer readable medium. The instructions may also be created using source code or any other known computer-aided design tool. A computer readable medium may be any physical medium capable of carrying those instructions and include a CD-ROM, DVD, magnetic or other optical disc, tape, and silicon memory (e.g., removable, non-removable, volatile or non-volatile).

A method and apparatus have been described for biasing and modulating a burst mode laser transmitter that has a fast response time when triggered from a totally off state. The circuit architecture employs an extremely fast RF power detection and laser triggering mechanism in combination with a power efficient analog modulation scheme, which allows the laser to be completely turned off during the periods when no information is being transmitted and rapidly turned on when it is called upon to transmit optical information. This feature is quite desirable in a number of environments, but particularly in an analog modulation environment such as exists in a typical cable television network because the overall system noise level is reduced when the laser is completely off and not transmitting data. The rapid transitions between the on-state and off-state occur in a highly synchronized manner that maintains the integrity of the analog signal. Furthermore, in some implementations the modulation mechanism employs an RF power amplifier for greater flexibility of the RF input signal levels. This RF power amplifier can be designed to operate in an efficient mode so that it is only consuming energy during those periods of time when information is being transmitted, thereby saving power and reducing unnecessary heat dissipation during idle periods. A power-on latching mechanism may be employed which turns on the RF power amplifier and maintains continuous power to it during those periods of time when information is being sent. This can eliminate the effects of turn-on transients when multiple bursts are being sent during consecutive time slots.

Although various embodiments are specifically illustrated and described herein, it will be appreciated that modifications and variations of the present invention are covered by the above teachings and are within the purview of the appended claims without departing from the spirit and intended scope of the invention.

The invention claimed is:

1. A burst mode laser transmitter, comprising:
a burst mode laser diode;
an input for receiving high frequency signals having downstream information and low frequency signals having upstream information;
a coupler for splitting a low frequency radio frequency (RF) data signal into a first RF data signal and a second RF data signal;
triggering circuitry for switching the burst mode laser diode on or off depending on whether the low frequency RF data signal is present at the input by:
   detecting whether the first RF data signal is present;
   biasing the laser diode to an on-state bias level when the first RF data signal is received by producing a control voltage that is proportional to a logarithm of an input power of the first RF data signal and outputting a differential signal to activate the laser diode when the control voltage exceeds a threshold voltage;
   biasing the laser diode to an off-state bias level when no RF data signal is present at the input,
modulation circuitry for modulating the laser diode when the second RF data signal is received by:

amplifying, via an RF power amplifier, the second RF data signal before it modulates the on-state bias level of the laser diode, wherein the RF power amplifier only turns on for a finite duration of time in response to a detected presence of the second RF data signal, modulating the on-state bias level at which the laser diode is biased with the second RF data signal.

2. The burst mode laser transmitter of claim 1 wherein the triggering circuitry includes:
an RF detector having an input for receiving the RF data signal and an output for providing a control signal in response to receipt of the RF data signal at the RF detector input;
a comparator coupled to the RF detector for receiving the control signal and generating a drive signal if the control signal exceeds a threshold value;
wherein the laser diode is coupled to the comparator for biasing the laser diode to the on-state bias level when the drive signal is received.

3. The burst mode laser transmitter of claim 2 wherein the RF detector has a response time less than a time period over which individual data bits or symbols in the RF data signal fluctuate in power level.

4. The burst mode laser transmitter of claim 2 wherein the control signal is the control voltage and the drive signal generated by the comparator is the differential signal.

5. The burst mode laser transmitter of claim 4 wherein the control signal is proportional to the logarithm of the RF data signal.

6. The burst mode laser transmitter of claim 1 further comprising a modulation arrangement that includes a latching arrangement for biasing the RF power amplifier into an active state only when the RF data signal is present at the input.

7. The burst mode laser transmitter of claim 2 further comprising a modulation arrangement comprising:
a latching arrangement for biasing the RF power amplifier into an active state only when the RF data signal is present at the input, the latching arrangement including a switching mechanism for biasing the RF power amplifier in response to receipt of the control signal from the RF detector.

8. The burst mode laser transmitter of claim 6 wherein the RF data signal is modulated in accordance with a QAM scheme and the latching arrangement is configured to bias the RF power amplifier into the active state for a period of time equal to or greater than at least a single QAM symbol period.

9. The burst mode laser transmitter of claim 8 wherein the latching arrangement is configured to bias the RF power amplifier into the active state for the period of time that is refreshed each time a subsequent RF data signal is received at the input.

10. A method for generating an optical data signal, comprising:
receiving an RF data signal that is to be transformed into the optical data signal;
splitting the RF data signal into a first RF data signal and a second RF data signal
biasing the laser diode to an on-state bias level when the first RF data signal is present by producing a control voltage that is proportional to a logarithm of an input power of the first RF data signal and outputting a differential signal to activate the laser diode when the control voltage exceeds a threshold voltage;
biasing the laser diode to an off-state bias level when no RF data signal is present at an input;
amplifying, via an RF power amplifier, the second RF data signal before it modulates the on-state bias level of the laser diode, wherein the RF power amplifier only turns on for a finite duration of time in response to a detected presence of the second RF data signal,
modulating the on-state bias level at which the laser diode is biased with the second RF data signal.

11. The method of claim 10 wherein receiving the RF data signal includes detecting the RF data signal with an RF detector having a response time less than a time period over which individual data bits or symbols in the RF data signal fluctuate in power level.

12. The method of claim 10 wherein the RF data signal is amplified by the RF power amplifier and further comprising biasing the RF power amplifier into an active state only when the RF data signal is detected.

13. The method of claim 12 further comprising latching the RF power amplifier into the active state when the RF data signal is detected for a period of time equal to or greater than a single data bit or symbol period.

14. The method of claim 13 further comprising refreshing the period of time for which the RF power amplifier is latched each time a subsequent RF data signal is detected.

15. At least one computer-readable medium encoded with instructions which, when executed by a processor, performs a method including:
causing a laser diode to be triggered into an on-state by a laser driver only when an RF data signal is detected;
causing the RF data signal to be amplified by latching a RF power amplifier into an active state for a predetermined period of time when the RF data signal is detected; and
causing an optical output signal from the laser diode to be modulated using the amplified RF data signal by adding a signal reflective of the RF data signal to a signal reflective of an output from a laser diode driver.

16. The computer-readable medium of claim 15 further comprising applying a bias to the RF power amplifier when the laser diode is triggered into the on-state and removing the bias when the laser diode is in an off-state.

17. The computer-readable medium of claim 15 further comprising latching the RF power amplifier into the active state when the RF data signal is detected for a period of time equal to or greater than a single data bit or symbol period.

18. The computer-readable medium of claim 17 further comprising refreshing the period of time for which the RF power amplifier is latched each time a subsequent RF data signal is detected.

19. An Optical Network Unit (ONU), comprising:
an optical receiver arrangement for transforming optical signals received over a communication network into Radio Frequency (RF) signals for delivery to customer equipment; and
an optical transmitter arrangement for transforming RF signals received from the customer equipment into optical signals directed onto the communication network, said optical transmitter arrangement including;
a burst mode laser diode;
a controller having an input for receiving an RF data signal, the controller including a triggering arrangement and a modulation arrangement;
wherein the triggering arrangement is configured to bias the laser diode to an on-state bias level when an RF data signal is present at the input to the controller and to an off-state bias level when no RF data signal is present at the input to the controller; and
wherein the modulation arrangement is configured to modulate the on-state bias level at which the laser diode is biased with the RF data signal only when the RF data signal is present at the input of the controller, said modulation arrangement including an RF power amplifier for amplifying the RF data signal before it modulates the on-state bias level of the laser diode, the laser diode being modulated with the RF data signal by adding a signal reflective of the RF data signal to a signal reflective of an output from a laser diode driver, said modulation arrangement further including a latching arrangement for biasing the RF power amplifier into an active state only when the RF data signal is present at the controller input, and a processor for controlling the latching arrangement in response to a control signal received from the triggering arrangement.

20. The Optical Network Unit of claim 19 further comprising a switching arrangement for selectively connecting and disconnecting an optical receiver from the customer equipment upon receipt of a command signal from the processor.

21. The Optical Network Unit of claim 20 wherein the processor is configured to receive the command signal from a network operator via the optical receiver arrangement.

* * * * *